United States Patent
Wang et al.

(10) Patent No.: US 6,372,635 B1
(45) Date of Patent: Apr. 16, 2002

(54) METHOD FOR MAKING A SLOT VIA FILLED DUAL DAMASCENE LOW K INTERCONNECT STRUCTURE WITHOUT MIDDLE STOP LAYER

(75) Inventors: Fei Wang, San Jose; Lynne A. Okada, Sunnyvale; Ramkumar Subramanian, San Jose; Calvin T. Gabriel, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/776,736

(22) Filed: Feb. 6, 2001

(51) Int. Cl.$^7$ .......................................... H01L 21/4763
(52) U.S. Cl. ........................ 438/638; 438/623; 438/637
(58) Field of Search ................................. 438/638, 623, 438/637

(56) References Cited

U.S. PATENT DOCUMENTS

| | | | |
|---|---|---|---|
| 6,100,587 A | * 8/2000 | Merchant et al. | 257/751 |
| 6,204,168 B1 | * 3/2001 | Naik et al. | 438/638 |
| 6,225,211 B1 | * 5/2001 | Tsui | 438/624 |
| 6,261,960 B1 | * 7/2001 | Yu et al. | 438/692 |
| 6,287,955 B1 | * 9/2001 | Wang et al. | 438/623 |
| 6,287,961 B1 | * 9/2001 | Liu et al. | 438/638 |
| 6,300,235 B1 | * 10/2001 | Feldner et al. | 438/618 |

* cited by examiner

Primary Examiner—Charles Bowers
Assistant Examiner—Stephen W. Smoot
(74) Attorney, Agent, or Firm—McDermott, Will & Emery

(57) ABSTRACT

An interconnect structure and method of forming the same in which a bottom anti-reflective coating/etch stop layer is deposited over a conductive layer. An inorganic low k dielectric material is deposited over the BARC/etch stop layer to form a first dielectric layer. The first dielectric layer is etched to form a slot via in the first dielectric layer. An organic low k dielectric material is deposited within the slot via and over the first dielectric layer to form a second dielectric layer over the slot via and the first dielectric layer. The re-filled via is simultaneously etched with the second dielectric layer in which a trench is formed. The trench extends in a direction that is normal to the length of the slot via. The entire width of the trench is directly over the via. The re-opened via and the trench are filled with a conductive material.

17 Claims, 6 Drawing Sheets

METHOD FOR MAKING A SLOT VIA FILLED DUAL DAMASCENE LOW K INTERCONNECT STRUCTURE WITHOUT MIDDLE STOP LAYER

RELATED APPLICATIONS

The present application contains subject matter related to subject matter disclosed in co-pending U.S. patent application Ser. No. 09/778,061, filed on Feb. 7, 2001 and U.S. patent application Ser. No. 09/778,064, filed on Feb. 7, 2001.

FIELD OF THE INVENTION

The present invention relates to the formation of metal interconnection layers during the manufacture of semiconductor devices, and more particularly to the formation of a damascene structure in a metal interconnect region by a via fill dual damascene technique.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by inter-wiring spacings. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor chips comprising five or more levels of metalization are becoming more prevalent as device geometries shrink to sub-micron levels.

A conductive plug filling a via hole is typically formed by depositing a dielectric interlayer on a conductive layer comprising at least one conductive pattern, forming an opening in the dielectric layer by conventional photolithographic and etching techniques, and filling the opening with a conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug and electrical contact with a conductive line.

High-performance microprocessor applications require rapid speed of semiconductor circuitry. The control speed of semiconductor circuitry varies inversely with the resistance and capacitance of the interconnect pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more as in sub-micron technologies, the interconnection capacitance limits the circuit node capacitance loading, and hence, the circuit speed. As integration density increases and feature size decreases in accordance with sub-micron design rules, e.g., a design rule of about 0.1 micron and below, the rejection rate due to integrated circuit speed delays severely limits production throughput and significantly increases manufacturing costs.

In prior technologies, aluminum was used in very large scale integration interconnect metalization. Copper and copper alloys have received considerable attention as a candidate for replacing aluminum in these metalizations. Copper has a lower resistivity than aluminum and improved electrical properties compared to tungsten, making copper a desirable metal for use as a conductive plug as well as conductive wiring.

In the formation of a dual damascene structure in a self-aligned manner, a conductive line and vias that connect the line to conductive elements in a previously formed underlying conductive layer, are simultaneously deposited. A conductive material is deposited into openings (e.g., the via holes and trenches) created in dielectric material that overlays the conductive interconnect layer. Typically, a first layer of dielectric material is deposited over a bottom etch stop layer that covers and protects the conductive interconnect layer. A middle etch stop layer is then deposited over the first dielectric layer. A pattern is then etched into the middle etch stop layer to define the feature, such as a via hole, that will later be etched into the first dielectric layer. Once the middle etch stop layer is patterned, a second dielectric layer is deposited on the middle etch stop layer. The hard mask layer may then be deposited on the second dielectric layer. A desired feature, such as a trench, is etched through the hard mask layer and the second dielectric layer. This etching continues so that the first dielectric layer is etched in the same step as the second dielectric layer. The etching of the two dielectric layers in a single etching step reduces the number of manufacturing steps. The bottom etch stop layer within the via hole, which has protected the conductive material in the conductive interconnect layer, is then removed with a different etchant chemistry. With the via holes now formed in the first dielectric layer and a trench formed in the second dielectric layer, conductive material is simultaneously deposited in the via and the trench in a single deposition step. (If copper is used as the conductive material, a barrier layer is conventionally deposited first to prevent copper diffusion.) The conductive material makes electrically conductive contact with the conductive material in the underlying conductive interconnect layer.

In efforts to improve the operating performance of a chip, low k dielectric materials have been increasingly investigated for use as replacements for dielectric materials with higher k values. Lowering the overall k values of the dielectric layers employed in the metal interconnect layers lowers the RC of the chip and improves its performance. However, low k materials, such as benzocyclobutene (BCB), hydrogen silsesquioxane (HSQ), SiOF, etc., are often more difficult to handle than traditionally employed higher k materials, such as an oxide. For example, inorganic low k dielectric materials are readily damaged by techniques used to remove photoresist materials after the patterning of a layer. Hence, a feature formed in an inorganic low k dielectric layer may be damaged when the photoresist layer used to form the trench is removed. This is of special concern in a dual damascene arrangement if formed in a conventional manner since the inorganic material in the lower, via layer, will be damaged two times. In other words, the inorganic dielectric material in the via layer will be damaged a first time by the removal of photoresist used in forming the via. The same inorganic low k dielectric material in the via layer will also be damaged a second time when the upper layer, the trench layer, is patterned and the photoresist is removed.

Another area for improvement in dual damascene arrangements concerns the use of a middle etch stop layer between the lower and upper dielectric layers. The middle etch stop layer remains after the lower dielectric layer is etched, to form a via, for example. The presence of the middle etch stop layer normally increases the overall k value of the interconnect region. Furthermore, the provision of a middle etch stop layer adds to the number of process steps that must be employed to create the dual damascene structure. For example, a middle etch stop layer deposition step and a middle etch stop layer patterning step are required. When there are multiple interconnect levels, as is common in current manufacturing technology, these additional steps may be repeated at the different interconnect levels. The additional steps increase manufacturing cost and reduce throughput.

Another area of concern in the formation of trench and via interconnect structures by dual damascene technique is the possibility of misalignment of the via and the trench. As seen in the top view of FIG. 13, a via 70 that has been formed in a lower dielectric layer is misaligned with respect to the trench (and the subsequently formed conductive line 60). Hence, only a portion of the via 70 is filled with conductive material to form the conductive plug 62.

A side view of the structure of FIG. 13 is depicted in FIG. 12. The pattern 68 formed in the middle etch stop layer 65 over the first dielectric layer 64 is misaligned with respect to the trench pattern. When the trench in the second dielectric layer 66 and the via are etched in a simultaneous anisotropic etch, the etch will proceed in accordance with the overlying trench pattern. This causes only a portion of the intended via to be opened, since the via is not filly underneath the trench. Upon subsequent filling with conductive material, the conductive plug 62 that is formed is narrower than intended. This undesirably increases the resistance of the conductive plug 62, leading to increases in RC.

There is a need for a method and arrangement for providing a dual damascene interconnect structure which allows low k dielectric layers to be employed in a via layer without risking significant damage to the formed via, while reducing concerns regarding the use of a middle etch stop layer between the lower and upper dielectric layers. There is also a need to assure that a full width of a via is provided directly underneath a conductive line formed in a trench so that the conductive plug in the via has its full intended width.

SUMMARY OF THE INVENTION

These and other needs are met by embodiments of the present invention which provide a method of forming an interconnect structure comprising the steps of depositing a diffusion barrier layer over a conductive layer and a first dielectric material over the diffusion barrier layer to form a first dielectric layer. The first dielectric material is an inorganic dielectric material. The first dielectric layer is etched to form a slot via in the first dielectric layer. The slot via extends with a slot length in a first direction within the first dielectric layer. A second dielectric material is then deposited in the slot via and over the first dielectric layer to form a second dielectric layer over the refilled slot via and the first dielectric layer. The second dielectric material is an organic dielectric material. The refilled slot via is etched simultaneously with a trench in the second dielectric layer such that a feature is formed that extends within the second dielectric layer in a second direction that is normal to the first direction. At least a portion of the slot via is etched. The feature has a width in the second direction that is less than the slot length, with the entire width of the feature being over the slot via.

The provision in a first dielectric layer of a slot via that is wider than the width of the trench assures that the conductive plug that is formed will be as wide as the overlying conductive line. Also, by depositing a second dielectric material within the via, after the initial formation of the via, the second etching of a via is through newly deposited dielectric material. This has the advantage of reducing the amount of damage sustained in the via formed in the organic dielectric material in the first dielectric layer by a resist removal process. The method of the invention allows low k inorganic dielectric material to be employed in the first dielectric layer, and organic low k dielectric material in the second dielectric layer. The organic low k dielectric material is less sensitive to damage from a photoresist removal process than inorganic low k dielectric material. Hence, by re-filling the via in the lower dielectric layer with organic low k dielectric material, damage to the inorganic low k dielectric material at the via site from a damaging photoresist removal process during the dual damascene method of interconnect formation is reduced. This has the effect of increasing structural integrity and the formation of the vias and the conductive plugs in the first dielectric layer.

The use of two different types of low k materials, such as organic and inorganic materials, allows etching of one dielectric layer without etching of the other dielectric layer. This obviates the need for the middle etch stop layer. The use of a BARC, provided as the diffusion barrier in certain embodiments of the invention, underneath the lower dielectric layer makes the patterning of the photoresist layer on the lower dielectric layer more precise, leading to better formed vias in the lower dielectric layer than would otherwise be formed when a patterned etch stop layer over the lower dielectric layer is not used.

The earlier stated needs are met by another embodiment of the present invention which provides a method of forming an interconnect structure comprising forming a diffusion barrier layer on a conductive layer and forming a first dielectric layer on the diffusion barrier layer. The dielectric material in the first dielectric layer is an inorganic dielectric material. A slot via is formed in the first dielectric layer, the slot via having a width and a length extending in a first direction in the plane of the first dielectric layer. A second dielectric layer is deposited on the first dielectric layer and in the slot via. The dielectric material in the second dielectric layer is an organic dielectric material. The second dielectric layer and the refilled slot via are simultaneously etched to form a trench in the second dielectric layer, and a via in the first dielectric layer. The trench has a width and a length extending in a second direction in the plane of the second dielectric layer. The first and second directions are substantially normal to one another. The width of the trench is less than the length of the slot via. The etched via has a width substantially equal to the width of the line and is substantially entirely under the line. The via and the trench are then filled with conductive material.

The earlier stated needs are also met by another embodiment of the present invention which provides an interconnect structure comprising a diffusion barrier layer on a conductive layer and a first dielectric layer comprising an inorganic dielectric material on the diffusion barrier layer. A patterned slot extends in a first direction in the first dielectric layer. A second dielectric layer over the first dielectric layer comprises an organic dielectric material, with some of the organic dielectric material being in the first dielectric layer within the patterned slot. A conductive stud is provided within a via formed in the patterned slot of the first dielectric layer. A conductive line is formed in the second dielectric layer and extends in a second direction normal to the first direction. The conductive line and the conductive stud have substantially the same width. Substantially the entire width of the conductive stud is located directly beneath the conductive line.

The foregoing and other features, aspects, and advantages of the present invention will become more apparent in the following detailed description of the present invention when taken in conjunction with the accompanying drawings.

DETAILED DESCRIPTION OF THE INVENTION

The present invention addresses and solves problems associated with the use of low k dielectric materials in the dielectric layers of a self-aligned dual damascene arrangement in a metal interconnect region of a semiconductor chip. Specifically, the present invention lowers the overall dielectric constant value of the film and prevents extensive damage to the lower dielectric layer of the dual damascene arrangement, while assuring that the conductive plug has a full width formed underneath the conductive line in a dual damascene arrangement. This is accomplished, in part, by providing an inorganic low k dielectric layer as the bottom dielectric layer in the dual damascene arrangement. A slot via is formed in the first dielectric layer that extends perpendicularly to the trench that will be formed in the second dielectric layer. The slot via is longer than the width of the trench. After forming the slot via, and removing the photoresist used to pattern this slot via, the slot via is re-filled with an organic dielectric material that is used to form the second dielectric layer. When the second dielectric layer is etched to form the line or other feature in the second dielectric layer, the filled slot via is again etched to re-open the via directly underneath the trench. The slot via thus assures that the via that is eventually formed has a full width directly underneath the trench. Also, the inorganic dielectric material is not subjected to a damaging photoresist removal process after the slot via has been re-filled. The use of two types of low k dielectric materials in the lower and upper dielectric layers, having different etch sensitivities, allows the elimination of an etch stop layer between the dielectric layers. This lowers the overall k value of the interconnect structure and reduces the number of processing steps and the manufacturing costs.

Figure 1:
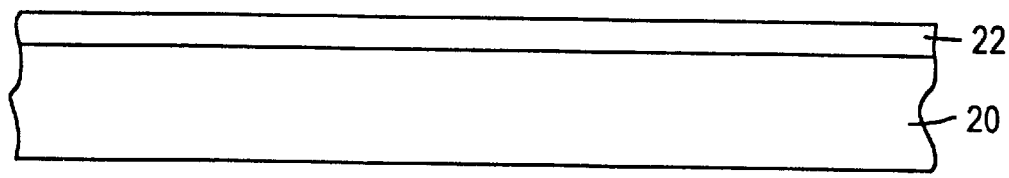
FIG. 1 is a cross-section of a metal interconnect portion of a semiconductor wafer after a first etch stop layer is deposited on an underlying conductive interconnection layer, in accordance with embodiments of the present invention.

FIG. 1 depicts a cross-section of a metal interconnect portion of a chip processed in accordance with embodiments of the present invention, at one stage of the processing. At this stage, a conductive layer 20 has been formed, which may be made of a metal, for example, or other conductive material. In especially preferred embodiments, the conductive metal is copper or a copper alloy, due to the earlier stated advantages of copper over other metals. A first etch stop layer 22 is formed, by deposition, for example, over the conductive layer 20. The first etch stop layer 22, in certain embodiments, is made of silicon carbide. Other materials may be used for the first etch stop layer 22, such as silicon oxynitride, silicon nitride, etc. A primary purpose of the first etch stop layer at 22 is to protect the conductive material 20 during etching of the overlying dielectric layers. The first etch stop layer 22 also serves as a diffusion barrier to prevent diffusion of copper or other conductive material into the surrounding dielectric material. Another purpose of the first etch stop layer 22 in certain embodiments of the invention, is as an anti-reflective coating (ARC), which improves the formation of the via in the first dielectric layer. Silicon carbide, as one example of an etch stop material, exhibits excellent properties as an ARC, and is therefore particularly suitable for use in the first etch stop layer 22.

Figure 2:
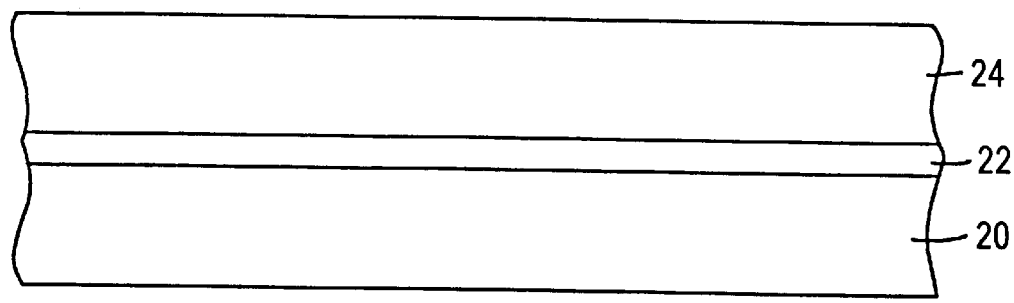
FIG. 2 is a cross-section of the metal interconnect portion of FIG. 1, after a first dielectric layer is formed on the first etch stop layer, in accordance with the embodiments of the present invention.

As shown in FIG. 2, a first dielectric layer 24 is then formed on the first etch stop layer 22. In the present invention, the material forming the first dielectric layer 24 is an inorganic dielectric material. In preferred embodiments of the invention, the inorganic dielectric material is a low k dielectric material. An example of an inorganic dielectric material is a silicon oxide, such as $SiO_2$. Examples of inorganic low k dielectric materials include methyl silsesquioxane (MSQ), hydrogen silsesquioxane (HSQ), and fluorinated tetraethyl orthosilicate (FTEOS). For purposes of example, assume that the first dielectric layer 24 is formed to a thickness of between about 1,000 and about 8,000 Å.

Figure 3:
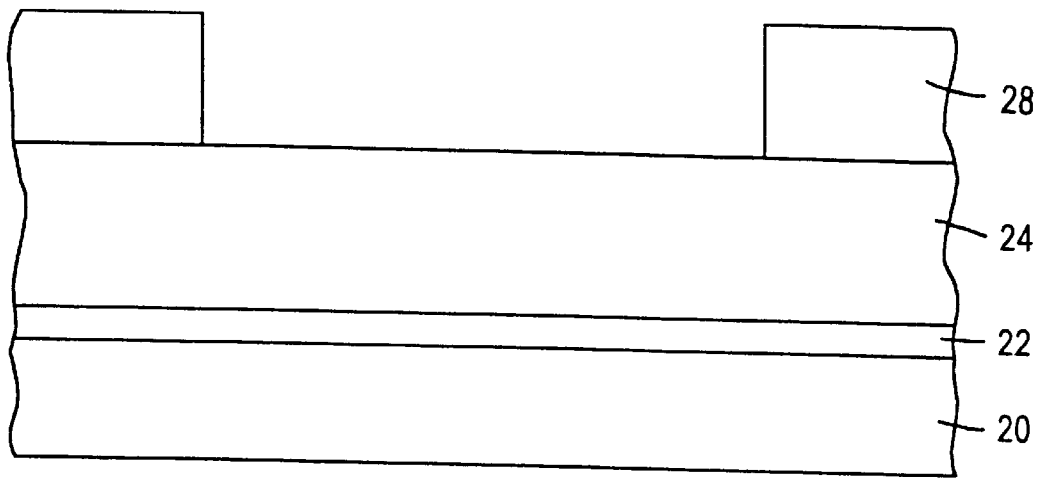
FIG. 3 is a cross-section of the portion of FIG. 2, following the deposition and patterning of a photoresist layer on the first dielectric layer to define a feature to be etched into the first dielectric layer, in accordance with the embodiments of the present invention.

FIG. 3 is a cross-section of the metal interconnect portion of FIG. 2 following the positioning and patterning of a photoresist layer 28 on the first dielectric layer 24. The pattern created within the photoresist layer 28 defines the feature, such as a slot via, that will eventually be etched into the first dielectric layer 24. When ARC provided as the first etch stop layer 22 helps the resolution of the feature in the photoresist layer 28.

Figure 11:
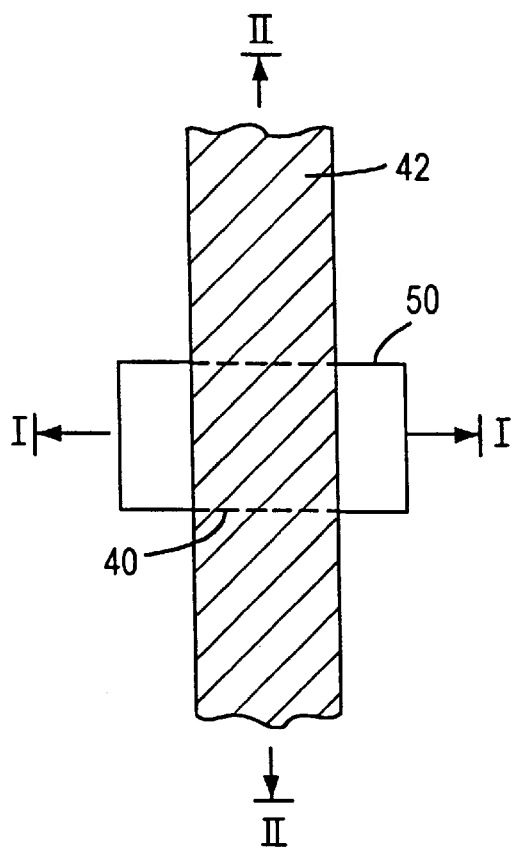
FIG. 11 is a top view of a portion of an interconnect arrangement having a slot via in accordance with embodiments of the present invention.
Figure 12:
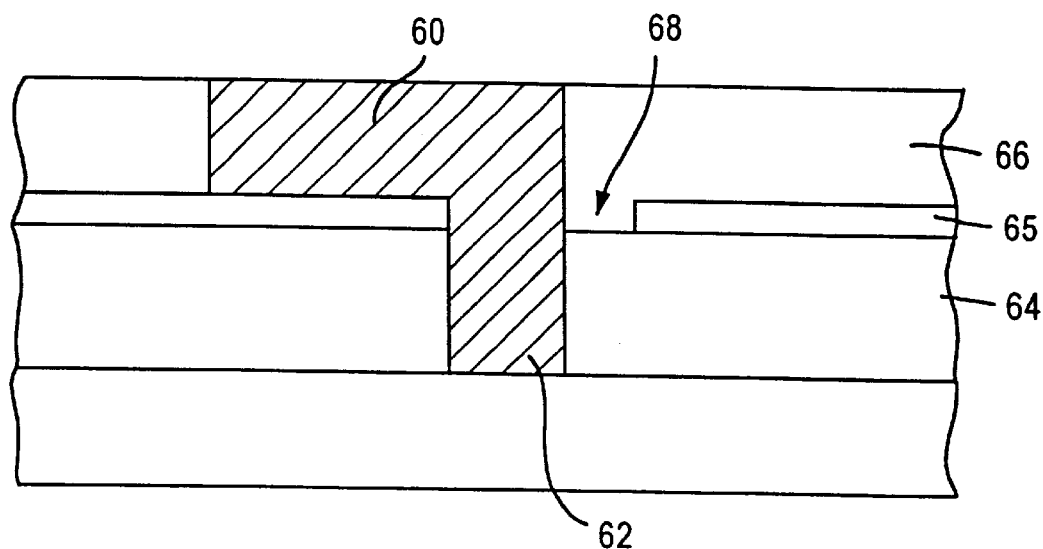
FIG. 12 is a cross-section of an interconnect structure formed in accordance with the prior art.
Figure 13:
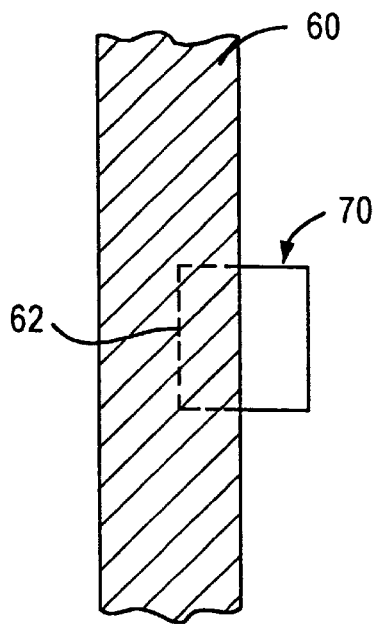
FIG. 13 is a top view of the interconnect structure of FIG. 12 formed in accordance with the prior art.

Unlike conventional vias, the slot via of the present invention has a length that is greater than the width of the trench that will be formed in the second dielectric layer. In order to assure that the slot will extend across the entire width of the trench, the length of the slot via in certain embodiments of the invention is made equal to the width of the trench plus two times the misalignment tolerance. For example, assuming that the misalignment tolerance is 8 nm, a perfectly aligned slot via will extend 8 nm on both sides of the trench, but the other end of the slot via will coincide with the other side of the trench. This assures that a via will be formed that extends completely under the entire width of the trench. The slot via will be perpendicular to the trench that will be formed, as depicted in FIG. 11. Since each slot via could possibly extend by a maximum tolerance on one side of a trench, the trench lines should be separated by more than twice the maximum tolerance to prevent two maximally misaligned vias connected to adjacent lines from contacting each other.

Figure 4:
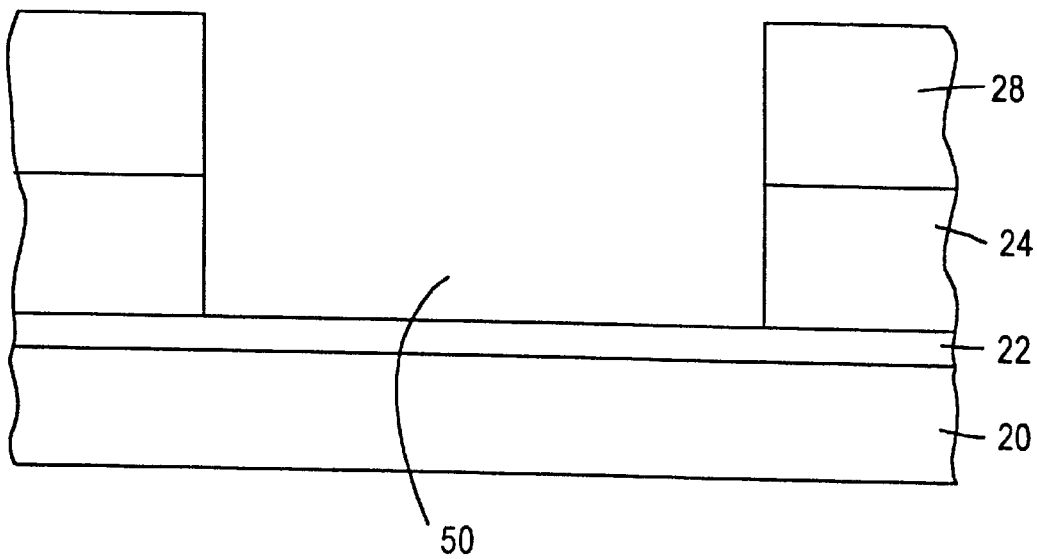
FIG. 4 is a cross-section of the portion of FIG. 3, after the first dielectric layer is etched to form a slot via in accordance with the pattern in the photoresist layer, in accordance with the embodiments of the present invention.

FIG. 4 is a cross-section of the portion of FIG. 3 following the etching of the first dielectric layer 24 in accordance with the embodiments of the present invention to form a slot via 50. The etchant should be selective such that the material on the first dielectric layer 24 is etched, with the etching stopping at the first etch stop layer 22. The etchant chemistry employed to etch the inorganic dielectric material in the first dielectric layer 24 may be $C_4F_8$/Ar/CO, $CHF_3$/CO/Ar $CHF_3$/$O_2$/Ar, $CF_4$, $C_4F_8$, or $C_2F_6$, for example.

Figure 5:
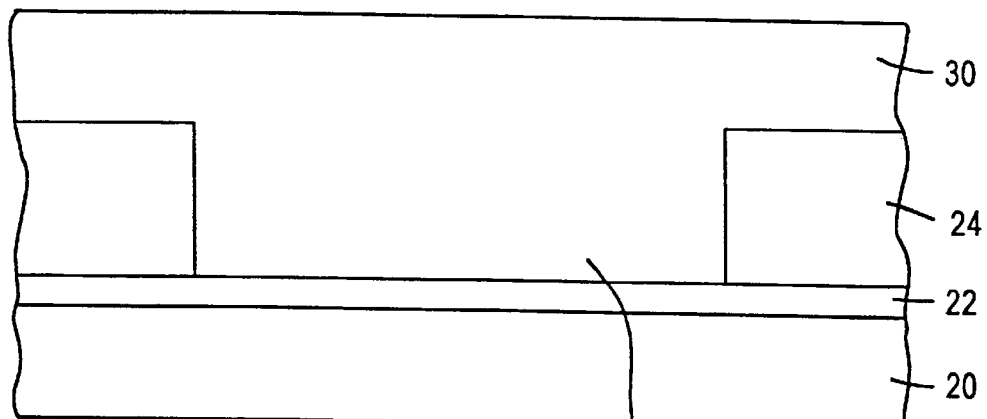
FIG. 5 is a cross-section of the portion of FIG. 4, following removal of the photoresist layer on the first dielectric layer, and the formation of a second dielectric layer on the first dielectric layer and the filling of the via in the first dielectric layer.

FIG. 5 is a cross-section of the portion of FIG. 4 following the removal of the photoresist layer 28 and the formation of a second dielectric layer 30 over the first dielectric layer 24. The dielectric material in the second dielectric layer 30 also fills the slot via 50 that was previously opened in the first dielectric layer 24, as was depicted in FIG. 4. This has the result that the previously opened slot via 50, which may have been damaged by the removal of the photoresist layer 28, has been refilled with dielectric material that has not been damaged. Two of the four sides of the re-filled slot via 50 will not be damaged, while the two remaining sides will remain somewhat damaged by the photoresist removal process.

The top surface of the first dielectric layer 24 may also be damaged by the photoresist removal process performed in FIG. 5. In certain embodiments of the invention, the damage is largely prevented by forming a cap layer over the first dielectric layer 24 prior to the patterning and etching of the slot via 50. An exemplary material is silicon oxide, although other materials may be used. The cap layer may remain in place, or may be removed by an etchant chemistry that does not include oxygen or hydrogen, so as not to damage the top surface of the first dielectric layer 24. An exemplary etchant is $C_4F_8$. The formation of a cap layer and its removal are not shown in the drawings. The second dielectric layer 30 is formed once the cap layer is removed, in these embodiments.

The dielectric material in the second dielectric layer 30 and in the now re-filled slot via in the first dielectric layer 24 is an organic dielectric material in the embodiments of the present invention. In particularly preferred embodiments, the organic dielectric material is an organic low k dielectric material. The organic low k dielectric material may be selected from a number of different materials, including SILK, benzocyclobutene, Nautilus, (all manufactured by Dow), polyfluorotetraethylene, (manufactured by DuPont), FLARE, (manufactured by Allied Chemical), etc. It is preferred for the material in the second dielectric layer 30 to have good gap filling qualities, so that the slot via 50 will be completely filled. Those of ordinary skill in the art may readily select such a material taking into account this consideration.

The use of a low k dielectric material in the upper, trench layer is advantageous in that reduction of line-to-line capacitance is even more critical than reducing capacitance in the via layer to increase circuit operating speeds. Providing an inorganic material in one of the dielectric layers and an organic material in the other of the dielectric layers enables good etch selectivity between the dielectric layers. When the re-filled via is etched, as described below, the etch selectivity allows the re-filled via to be precisely etched, as only the second dielectric material is etched, and not the surrounding first dielectric material.

The via is re-filled with the same material as in the upper, second dielectric layer. It should be appreciated that the use of the same dielectric material in the second dielectric layer 30 and in the re-filled via in the first dielectric layer 24 ensures that a single etchant can be employed to etch both the trench and the re-filled slot via 50.

Figure 6:
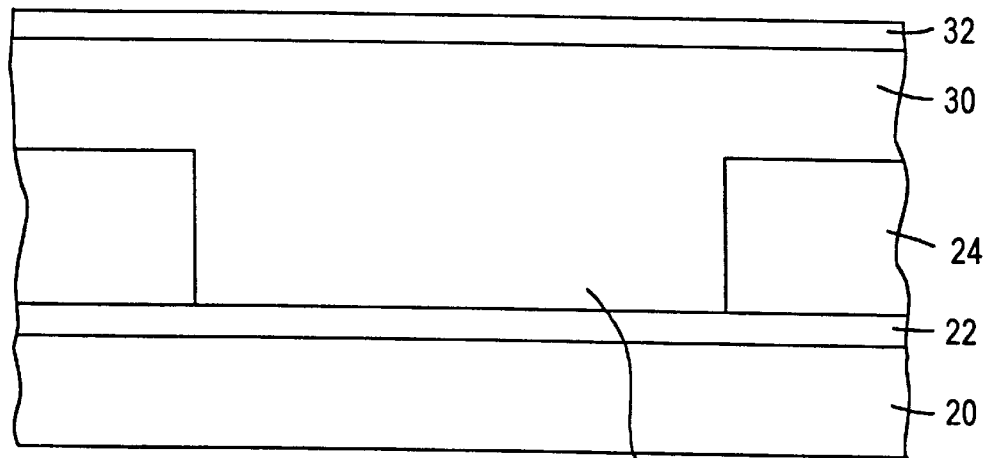
FIG. 6 is a cross-section of the portion of FIG. 5, following the deposition of a hard mask layer on the second dielectric layer, in accordance with the embodiments of the present invention.

In certain embodiments, planarization is not required due to the spin-on nature of the second dielectric layer 30. In other embodiments, planarization of the second dielectric layer 30 is performed, such as by CMP. In either embodiment, a hard mask layer 32 is deposited on the second dielectric layer 30, as depicted in FIG. 6. The hard mask layer 32 may comprise silicon nitride, for example, and serves to selectively protect the second dielectric layer 30 during the etching steps.

Figure 7:
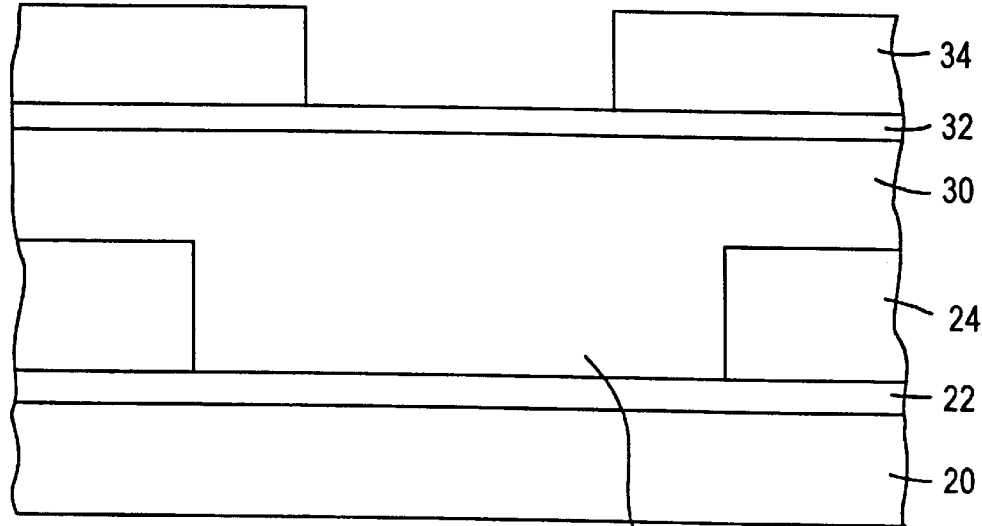
FIG. 7 is a cross-section of the portion of FIG. 6, following the positioning and patterning of a photoresist layer on a second dielectric layer to define a first feature to be etched in the second dielectric layer, in accordance with the embodiments of the present invention.

As shown in FIG. 7, a photoresist layer 34 is then deposited and patterned on the hard mask layer 32. The pattern in the photoresist layer 34 contains a feature that is to be etched into the second dielectric layer 30. The desired feature, such as a trench opening, is created (see FIG. 8) by etching the hard mask layer 32 and the second dielectric layer 30. The etching continues through the portion of the re-filled slot via 50 that is directly under the trench formed in the second dielectric layer 30. The etching stops as the first etch stop layer 22. As can best be appreciated in FIG. 8, only a portion of the slot via 50 is etched in this step, with the remaining portion of the slot via 50, i.e., that portion not directly under the trench, still containing the second dielectric material. Since the material surrounding the re-filled via is inorganic dielectric material and the via was re-filled with organic dielectric material, the first dielectric layer is not etched in this selective etching process, except for the reopening of the via. In preferred embodiments of the invention, multiple etching steps are used to create the structure depicted in FIG. 9. These steps include etching the hard mask layer 32, followed by simultaneously etching the second dielectric layer 30 and the re-filled slot via 50 in the first dielectric layer 24.

A suitable etchant chemistry for etching the nitride hard mask layer 32 is $CHF_3/N_2$. In certain embodiments of the present invention, the hard mask layer 32 may be an oxide, for example. The etchant chemistry employed to etch the organic dielectric material in the second dielectric layer 30 and the re-filled via may be $N_2/H_2$, or $O_2/N_2/Ar$. These etchants are exemplary only, as a suitable etchant may be employed depending on the particular organic dielectric material comprising the second dielectric layer.

As stated earlier, the use of two different types of dielectric materials with different etch sensitivities allows precise formation of the via from the re-filled via. Only the second dielectric material, which is in the re-filled via, will be etched in the first dielectric layer during the etch of the second dielectric layer and the re-filled via. The first dielectric material, which previously filled but now surrounds the re-filled via in the first dielectric layer, is not etched during the re-opening of the via.

The photoresist layer 34 may be removed by an etching or oxygen ashing process. Since the second dielectric layer 30 and the re-opened via 36 are formed from organic dielectric material, the trench and the via 36 that are formed in the organic dielectric material is more tolerant of the photoresist removal process than inorganic dielectric material, and thus shows less damage from the photoresist removal process. This provides an improvement in the structure of the via 36 and the trench over processes in which inorganic dielectric material in the via layer and/or the trench layer are subjected to multiple process steps in which the via may be damaged, and even single photoresist removal process steps in which the trench is damaged.

Figure 8:
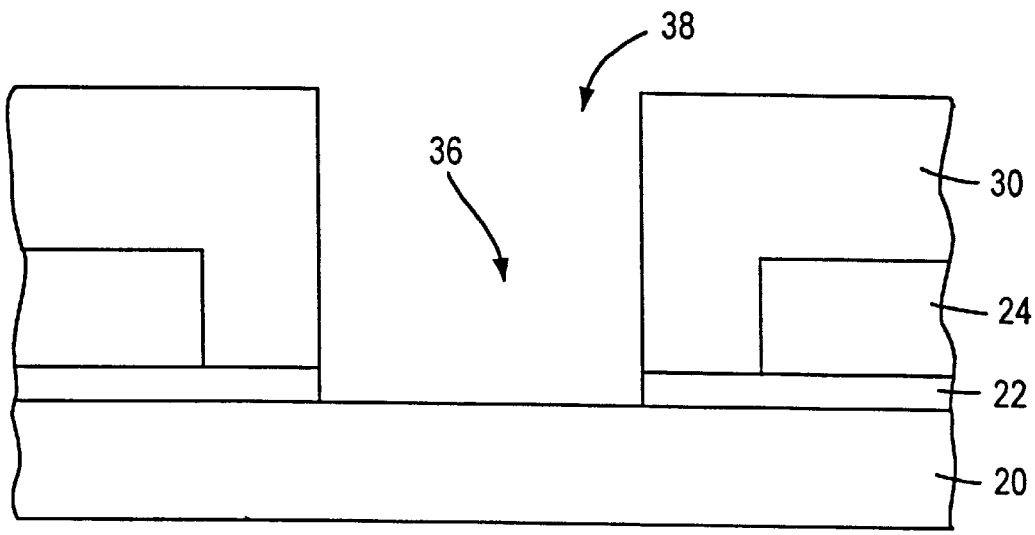
FIG. 8 is a cross-section of the portion of FIG. 7, after etching through the hard mask layer and the second dielectric layer in accordance with the pattern in the photoresist layer to create a first feature in the second dielectric layer and remove the photoresist layer, and etching through the re-filled slot via and the bottom diffusion layer to define a via in the first dielectric layer, in accordance with the embodiments of the present invention.

The first etch stop layer 22 (the diffusion barrier) is now etched within the re-opened via 36 that now exists in the first dielectric layer 24. This removes the etch stop material covering the conductive material on the conductive layer 20. A suitable etchant to remove the etch stop material, for example silicon carbide, while not adversely affecting the conductive material (e.g., copper), is $CHF_3/N_2$. This etchant chemistry prevents copper oxidation, removes sidewall polymer with $N_2$, and etches the silicon carbide without undercutting the dielectric material in the second dielectric layer 30 or the dielectric material in the first dielectric layer 24. The etching of the first etch stop layer 22 leaves a first opening 36, such as a via hole, and a second opening 38, such as a trench. The etching steps in FIG. 8 are performed in situ, in preferred embodiments of the present invention.

Figure 9:
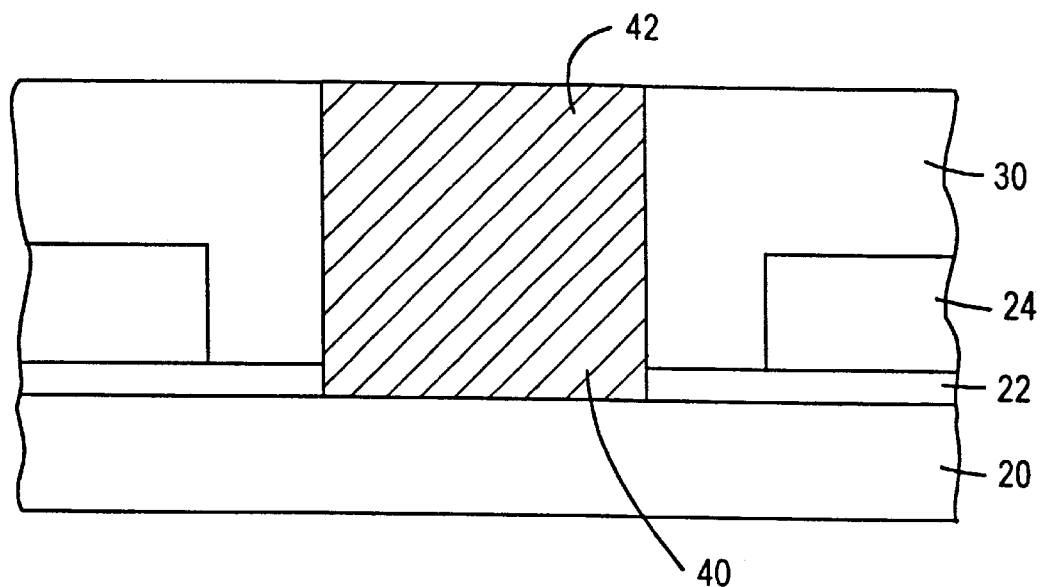
FIG. 9 is a cross-section of the portion of FIG. 8, taken along line I—I of FIG. 11, after the first and second features are filled with a conductive material, in accordance with the embodiments of the present invention.
Figure 10:
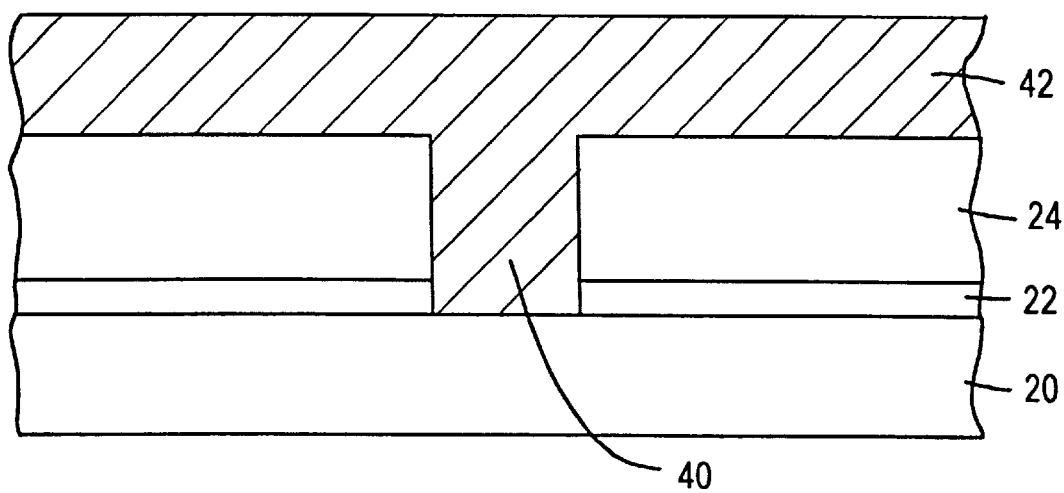
FIG. 10 is a cross-section of the portion of FIG. 8, taken along line II—II of FIG. 11, after the first and second features are filled with a conductive material, in accordance with the embodiments of the present invention.

The via hole 36 and the trench 38 are now filled in a simultaneous deposition step with conductive material, preferably copper in certain embodiments of the present invention. Deposition of a barrier layer, typically employed to prevent copper diffusion, is not depicted in order not to obscure the invention, although one can be provided. Also, in certain embodiments of the invention, barrier layers not needed as certain low k dielectric materials form a self-barrier against copper diffusion. After chemical mechanical planarization (CMP), the dual damascene structure of FIG. 9 is formed with the via (or stud) 40 electrically connecting the underlying conductive layer 20 to the conductive line 42 formed in the trench 38.

The filling of a previously formed slot via during the position of a second dielectric layer allows the formation of a via that is subjected to only one damaging process, instead of multiple damaging processes, such as photoresist removals. This enhances the integrity of the features formed in the lower dielectric layer, such as a via layer, while allowing the use of inorganic low k dielectric materials in the bottom layer of a dual damascene arrangement. The use of a slot via ensures that the via which is ultimately formed will extend completely underneath the trench. Furthermore, the use of organic dielectric material in the trench layer provides a trench layer that is relatively free of significant plasma ashing or wet clean damage, which provides a significant improvement in the quality of the trench layer.

Although the present invention has been described and illustrated in detailed, it is to be clearly understood that the same is by way of illustration and example only and is not to be taken by way of limitation, the scope of the present invention being limited only by the terms of the appended claims.

What is claimed is:

1. A method of forming an interconnect structure, comprising the steps of:
    depositing a diffusion barrier layer over a conductive layer;
    depositing a first dielectric material over the diffusion barrier layer to form a first dielectric layer, the first dielectric material being an inorganic dielectric material;
    etching the first dielectric layer to form a slot via in the first dielectric layer, the slot via extending with a slot length in a first direction within the first dielectric layer;
    depositing a second dielectric material in the slot via and over the first dielectric layer to form a second dielectric layer over the slot via and the first dielectric layer, the second dielectric material being an organic dielectric material; and
    simultaneously etching the slot via and the second dielectric layer such that a feature is formed that extends within the second dielectric layer in a second direction that is normal to the first direction, and at least a portion of the slot via is etched, the feature having a width in the second direction that is less than the slot length, with the entire width of the feature being over the slot via.

2. The method of claim 1, wherein the organic dielectric material is selected from at least one of SILK, benzocyclobutene, FLARE, polyflurotetraethylene, and Nautilus.

3. The method of claim 2, wherein the inorganic dielectric material is selected from at least one of silicon dioxide, methyl silsesquioxane (MSQ), hydrogen silsesquioxane (HSQ), and fluorine tetraethylorthosilicate (FTEOS).

4. The method of claim 3, wherein the step of etching the first dielectric layer includes etching with $C_4F_8/Ar/CO$ or $CHF_3/CO/Ar$.

5. The method of claim 4, wherein the step of simultaneously etching the slot via and the second dielectric layer includes etching with at least one of $N_2/H_2$ and $O_2/N_2/Ar$.

6. The method of claim 5, further comprising depositing conductive material simultaneously in the slot via and the feature.

7. The method of claim 6, wherein the conductive material is copper.

8. The method of claim 2, wherein the step of etching the first dielectric layer includes etching with $C_4F_8/Ar/CO$.

9. The method of claim 1, wherein the inorganic dielectric material is selected from at least one of silicon dioxide, methyl silsesquioxane (MSQ), hydrogen silsesquioxane (HSQ), and fluorine tetraethylorthosilicate (FTEOS).

10. The method of claim 1, wherein the diffusion barrier layer comprises a material that is an anti-reflective coating.

11. A method of forming an interconnect structure comprising:

forming a diffusion barrier layer on a conductive layer;

forming a first dielectric layer on the diffusion barrier layer, dielectric material in the first dielectric layer being an inorganic dielectric material;

forming a slot via in the first dielectric layer, the slot via having a width and a length extending in a first direction in the plane of the first dielectric layer;

depositing a second dielectric layer on the first dielectric layer and in the slot via, wherein dielectric material in the second dielectric layer is an organic dielectric material;

simultaneously etching in the second dielectric layer and in the slot via to form a trench having a width and a length extending in a second direction in the plane of the second dielectric layer, and a via in the first dielectric layer, wherein: the first and second directions are substantially normal to one another, the width of the trench is less than the length of the slot via, and the etched via has a width substantially equal to the width of the trench and is substantially entirely under the trench; and filling the via and the trench with conductive material.

12. The method of claim 11, wherein the organic dielectric material is selected from at least one of SILK, benzocyclobutene, FLARE, and polyflurotetraethylene.

13. The method of claim 12, wherein the inorganic dielectric material is selected from at least one of silicon dioxide, methyl silsesquioxane (MSQ), hydrogen silsesquioxane (HSQ), and fluorine tetraethylorthosilicate (FTEOS).

14. The method of claim 13, wherein the step of forming a slot via includes etching the inorganic dielectric material with $C_4F_8/Ar/CO$.

15. The method of claim 14, wherein the step of simultaneously etching in the second dielectric layer and in the slot via includes etching with at least one of $N_2/H_2$ and $O_2/N_2/Ar$.

16. The method of claim 15, wherein the conductive material is copper.

17. The method of claim 11, wherein the diffusion barrier layer comprises anti-reflective coating material.

* * * * *